Oct. 21, 1969 J. D. SCOTT 3,474,316

SCR TRIGGERING CIRCUIT

Original Filed Sept. 14, 1966 2 Sheets-Sheet 1

INVENTOR.
JUNIUS DENNY SCOTT
BY
CAROTHERS & CAROTHERS
HIS ATTORNEYS

SCR TRIGGERING CIRCUIT
Original Filed Sept. 14, 1966 
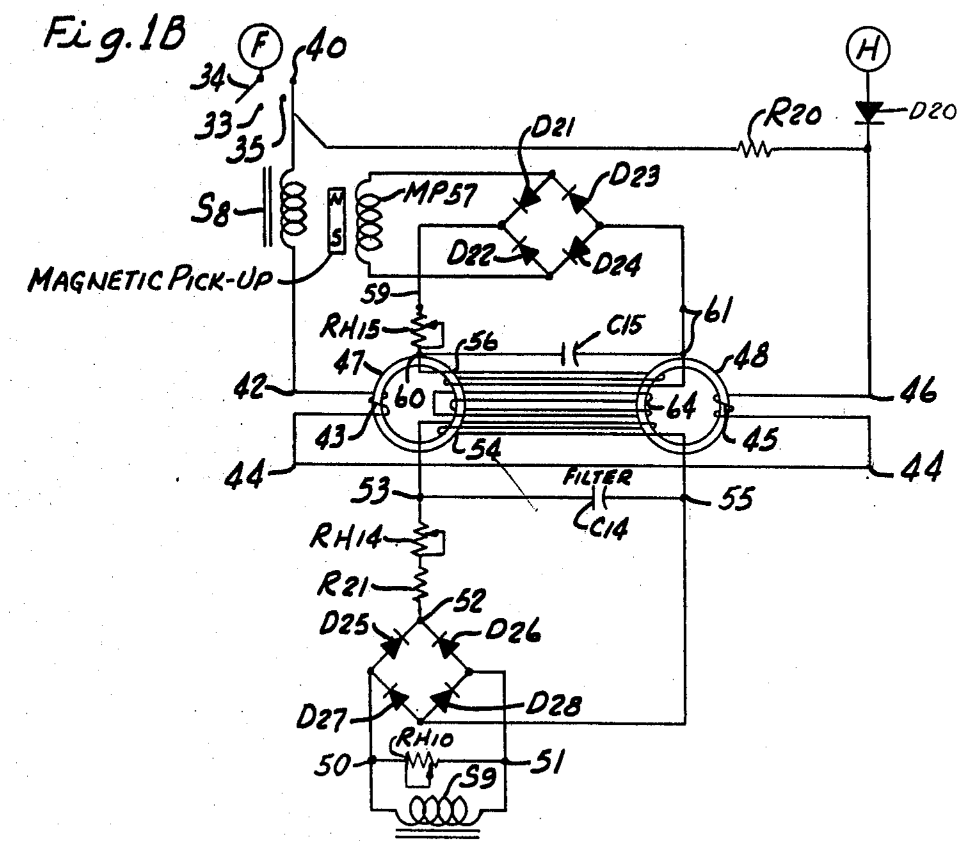
Fig. 1F
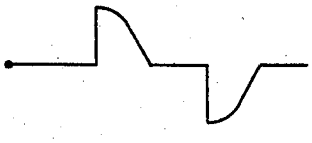
WAVEFORM ACROSS R20
Fig. 1G
WAVEFORM AT F OF DC-SCRT
INVENTOR.
JUNIUS DENNY SCOTT
BY
CAROTHERS & CAROTHERS
HIS ATTORNEYS 3,474,316
SCR TRIGGERING CIRCUIT Junius Denny Scott, Homer City, Ind., assignor to FMC Corporation, San Jose, Calif., a corporation of Delaware Continuation of application Ser. No. 579,385, Sept. 14, 1966. This application Oct. 10, 1968, Ser. No. 777,949
Int. Cl. H02p 1/42, 3/18, 5/38
U.S. Cl. 318—227 16 Claims

ABSTRACT OF THE DISCLOSURE

A triggering circuit for providing timed pulses at the gate of a power SCR which is feeding an inductive load from an AC supply for a controlled fraction of each cycle. The circuit utilizes a conventional UJT pulse forming network in combination with a wave-shaping network to extend the duration of the pulse in applying it to the SCR gate. Means are also provided whereby an external D.C. signal can be used to automatically vary the timing of the pulses in accordance with said signal and thereby automatically control the power delivered to the load.

This invention relates generally to an electronic control unit employing solid state semiconductor circuits and more particularly to solid state semiconductor circuitry for triggering an SCR feeding a variable inductive DC load.

This application is a continuation of application Ser. No. 579,385, filed Sept. 14, 1966, now abandoned.

Variable electrical loads of the type referred to require a control that provides a progressive linear change in the average power drawn by the load. Such a type of control may be approximated by a manually operated potentiometer, but it is difficult to make the increment operation thereof produce a linear variation in the operation of the variable load.

It is well known to use an SCR with an AC supply to supply a load with power for a controlled fraction of each AC cycle, the control being provided by the timing of the firing pulses delivered to the gate of the SCR. The circuitry of the present invention utilizes an unijunction transistor network for forming the firing pulse and an isolated wave-shaping network to extend the duration of the timing pulse in applying it to the SCR gate so that the load current will be permitted to build up above the value of the SCR holding current while power is applied to the gate to keep the SCR turned on. The power supply for the UJT circuit may be phase shifted relative to the AC supply for the load so that the gate triggering pulse may be obtained at or prior to the initiation of the positive moving half cycle of the power wave, and, consequently, the full half cycle of the AC power supply may be delivered to the load if so desired.

The accompanying drawings show for the purpose of exemplification, without limiting the invention or claims thereto, certain practical embodiments illustrating the principles of this invention wherein:

FIG. 1B is a schematic diagram of an additional unit circuit that provides a pulsed input to the DC Signal Input terminals of the control circuitry shown in FIG. 1A.

FIG. 1C is a schematic diagram of an alternating current source.

FIG. 1D is a schematic diagram of an alternating current source with a phase shift network.

FIG. 1E is a schematic diagram of a low voltage on and off control.

FIG. 1F is a schematic representation of the voltage wave form across resistor R20 in the circuitry shown in FIG. 1B.

FIG. 1G is a schematic representation of the voltage wave form across the terminals F and H as shown in FIG. 1B.

Figure 1A:
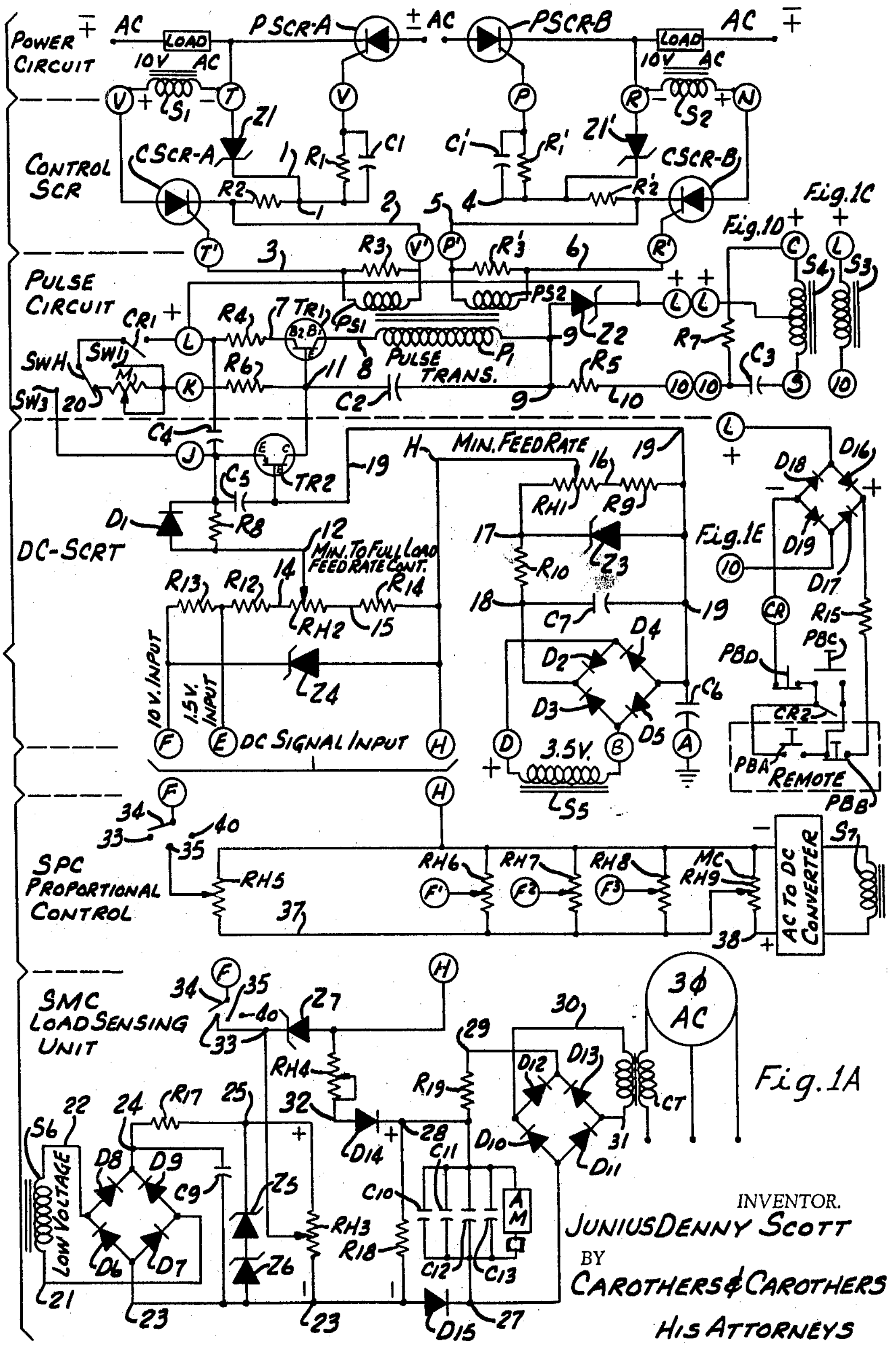
FIG. 1A is a composite circuit diagram including the several unit circuits providing the triggering control circuit comprising this invention.

Referring to FIG. 1A of the drawings, the first unit of the circuitry disclosed is the power circuit which includes a power SCR, identified as PSCR–A, connected in series with the load across an AC supply. The load may be of any character such as resistive type load which would be employed in computer type circuits or it might be an inductive type load such as an electromagnetic vibratory feeder. A feeder load of this character is highly inductive.

The power circuit includes a terminal T that is connected between the load and the gate of PSCR–A and a terminal V which is connected directly to the gate of PSCR–A. A second, identical power circuit is provided which includes an SCR, identified as PSCR–B, in series with a second load. This second circuit is provided with a terminal P connected to the gate of PSCR–B and a terminal R which is connected between the cathode of PSCR–B and the load. When the gates of the power silicon controlled rectifiers PSCR–A and PSCR–B are triggered with a current pulse during the positive half-cycle of the AC input wave, the rectifiers are turned on and they will remain on during the remainder of that half-cycle.

The terminals U and T have an alternating current voltage of approximately ten volts applied thereto through a transformer secondary S1. The terminals R and N likewise have a low voltage AC connected thereacross from the secondary transformer winding S2. The terminals U and N are indicated as having a positive polarity for use as a reference even though they receive an AC voltage.

The power circuit is one unit differentiated from the other units comprising the overall circuitry making up the present invention and it is indicated in FIG. 1A above the dotted line that passes through the terminals U, T, V, P, R and N.

The second unit of the overall circuitry is indicated as the control SCR portion of the circuit which comprises the silicon controlled rectifiers CSCR–A and CSCR–B. The anode of CSCR–A is connected directly to the terminal U and the cathode is connected to a resistance R2. The gate of PSCR–A is connected through the terminal V to a network that includes resistance R1 and condenser C1 connected in parallel, the other end of which is connected by line 1 to resistance R2. The terminal T has the anode of the Zener diode Z1 connected thereto and the cathode of the same is connected to line 1. The connection between CSCR–A and resistance R2 is connected to the terminal V′. The gate of CSCR–A is connected to the terminal T′. The line 2 connected to the terminal V′ is also connected to one of the secondaries PS1 of the pulse transformer P1, the other side of which is connected to the line 3 and the terminal T′. The load terminator resistance R3 is connected across the lines 2 and 3 of this secondary of the pulse transformer to provide a load on the secondary when the circuit to CSCR–A is opened and thereby prevent damage to the transformer.

The control SCR portion of the circuit is adapted to receive brief pulses from the pulse transformer P1 and to extend the time duration of these pulses and apply them to the gates of the power SCR's PSCR–A and PSCR–B. This wave shaping function is necessary for highly inductive loads since the gates of the power SCR must be turned on for a sufficient period of time to permit the load current to build to a point in excess of the holding current value. The Zener diode Z1 clips the rectified wave input from S1 which is transmitted through R2 from the point when CSCR–A has been turned on. This squared pulse is transmitted through the R1–C1 network to the gate of the power SCR with the capacitor C1 acting as a temporary short so that the maximum available current will be applied to the SCR gate at the beginning of the pulse to achieve complete activation of the gate junction area when the load current starts to flow.

As shown in the drawings, the power silicon controlled rectifier PSCR–B is independent of PSCR–A and is connected to the pulse transformer P1 in the same manner as PSCR–A. The gate of PSCR–B is connected to the terminal P and thence to the network including the condenser C1′ connected in parallel with resistance R1′, the other end of the network being connected by the line 4 to one side of the R2′ resistor, the other side of which is connected by the line 5 to the cathode of the silicon controlled rectifier CSCR–B.

The cathode of PSCR–B is connected to the terminal R and thence to the anode of the Zener diode Z1′ the cathode of which is connected to line 4. The low voltage transformer secondary S2 is connected across the terminals R and N, and N is connected directly to the anode of the silicon controlled rectifier CSCR–B. The gate of CSCR–B is connected to the terminal R′ and thence by means of the load 6 to one side of a secondary PS2 of the pulse transformer P1. The other side of this secondary PS2 is connected by the line 5 to the terminal P′ and to the cathode of CSCR–B. A resistance R3′ is connected between the lines 5 and 6 across the secondary of the pulse transformer. It will be apparent that the circuitry associated with the silicon controlled rectifiers PSCR–B and CSCR–B is the same as the circuitry associated with the silicon controlled rectifiers PSCR–A and CSCR–A and operates in an identical manner with both circuits being adapted to receive timing impulses from the pulse transformer P1.

The next unit circuit built upon that previously described is the pulse circuit including the pulse transformer P1. The primary of the pulse transformer is connected to a base B1 of a unijunction transistor TR1 by the line 8. The second base B2 of this transistor is connected by the line 7 to a resistor R4 the other end of which is connected to the terminal L which is indicated in this circuit for reference purposes as positive. The terminal L in turn is connected directly to the cathode of the Zener diode Z2 the anode of which is connected through the line 9 to the other end of the primary of the pulse transformer P1. The line 9 is also connected to one side of the pulsing condenser C2 the other side of which is connected by the line 11 to the emitter of the unijunction transistor TR1 and by the line 11 to the end of the resistor R6 the other end of which is connected to the terminal K. Line 9 is likewise connected to one end of a resistor R5 the other end of which is connected to terminal 10. For convenience, the terminal L is shown in two locations on each side of the circuit. Different sources of power may be connected between the terminal L and terminal 10.

In FIG. 1C, a transformer secondary S3 is shown supplying a low voltage alternating current to the terminals L and 10. Such a source of power may be employed. Furthermore T′ terminal may be connected directly to the cathode of the power rectifier PSCR–A and the terminal V′ may be connected directly to the gate of PSCR–A thereby eliminating the control SCR circuitry and its function. It will be noted from the portion of the pulse circuit just described that the source of low voltage AC, using the circuit of FIG. 1C across terminals L and 10, is connected across the Zener diode Z2 in series with resistor R5. This Zener diode will chop over the sine wave delivered by the transformer secondary S3 permitting chopped unidirectional waves to pass through the Zener Z2 and the resistance R5 of the circuit. These square waves are passed to the condenser C2 through the fixed resistor R6, K terminal, variable resistor M, switch SWH, and a control relay front contact CR1 which would be closed when the circuit has been energized. As the condenser C2 builds up, it reaches the peak point voltage of the unijunction transistor TR1. The condenser then discharges through the emitter and base B1 of the transistor to line 8 and the pulse transformer primary. This sends a pulse in each of the secondaries PS1 and PS2. The manual control potentiometer M may be regulated to regulate the operation of the load since the variation in this resistance will result in a similar variation in the time necessary for C2 to reach the peak point voltage.

Thus, the pulse circuit may be operated directly from an alternating current source such as indicated by the secondary S3 in FIG. 1C. However, in some of the circuits it is desirable to employ a phase shift in the operation of the pulse circuit which provides a triggering pulse out of the UJT earlier than would otherwise be possible and also provides a better control for an element in the next circuit to be described. The phase shift circuit is illustrated in FIG. 1D wherein the secondary winding of the supply transformer S4 has its ends connected to terminals C and S and has a midtap connected directly to the terminal L. The C terminal is connected through a resistor R7 to terminal 10 and S terminal is connected through the condenser C3 to the terminal 10. With the network of FIG. 1D, the supply voltage wave applied to the terminals C and S will be phase shifted when applied to the input terminals to the pulse forming network L and 10 so as to, in effect, lead the supply voltage wave form by some small phase angle. One purpose of this phase shifting network is to permit the charge on the capacitor C2 to build up prior to the application of the positive voltage wave form to the power circuit so that the gates of the power SCR's PSCR–A and PSCR–B can be fired at or near the starting point of said wave form so as to permit all of the available power to be delivered to the load, if so desired. Furthermore, a transistor TR2 in the next unit of this control circuit to be described, may be operated at a lower level, in a more linear portion of its transfer curve, since the buildup of charge upon the capacitor C2 can be achieved over a greater time period.

In FIG. 1E, there is shown a control circuit for turning the aforedescribed triggering circuitry off and on. An AC source is provided between the terminal L and terminal 10, which may be connected directly through an AC relay and control pushbuttons, or these terminals may transfer a source of power to a full wave rectifier represented by the diodes D16 and D17, D18 and D19 to operate a DC relay CR. This full wave rectifier has its positive and negative connections connected through the relay and a resistance R15 and a series of pushbuttons, one being a start pushbutton PBC which closes the circuit and is placed in parallel with a holding contact CR2 of the relay. The relay is likewise connected in series with the circuit opening or stop pushbutton PBD. A duplicate set of the closing and opening pushbuttons are provided and are shown included in a box indicated by dotted lines. This box may comprise a remote control containing only the second set of closing and opening pushbuttons PBA and PBB, respectively. When the pushbutton PBC is depressed, the relay CF is energized through the resistance R15 and contact CR2 remains closed so long as there is voltage to the terminals L and 10 and will remain closed until the stop pushbutton PBD is depressed. Upon energization of the CR relay, the CR1 contact will also close in order to connect the input voltage terminal L through the switch SWH to the pulse forming circuit. The circuit of FIG. 1E is a low power circuit controlling a contact CR1, also in a low power circuit, for switching power to the load; consequently, large contactors are not necessary in the power circuit for turning the power to the load on and off.

The next circuit to be described is designated as the DC–SCRT circuit and is adapted to receive a direct current signal input and to provide an output resistance between the capacitor C2 and the supply voltage terminal L in place of the manual control potentiometer M. When this circuitry is utilized, the switch SWH is connected to the contact SW3 which connects the DC–SCRT circuit through CR1 to the terminal L.

The purpose of the DC–SCRT circuit is to permit an external DC signal to be used to control the firing of the power silicon control rectifiers PSCR–A and PSCR–B and, hence, to control the amount of power delivered to the load. When the loads are the driving magnets of electromagnetic vibratory feeders, the feed rates of such feeders can be controlled from a minimum, or zero feed rate, up to the maximum desired feed rate by controlling the power delivered to the magnets. Since power must be supplied to an electromagnetic vibratory feeder even at the zero feed rate, the power silicon controlled rectifier will have to operate over at least some portion of the power cycle and, consequently, a DC voltage of a minimum value will have to be supplied by the DC–SCRT circuit and applied to the transistor TR2 to set the firing point of the pulse forming condenser C2 previously described. This minimum DC voltage is obtained from an AC source through the secondary S5 and the transformer is rectified by the full wave rectifier D2, D3, D4 and D5, and is supplied across resistor R9 and a portion of the control potentiometer RH1 between the emitter and base of the transistor TR2 to fix its operating point and hence its effective resistance as determined by the value of its collector current in the aforedescribed pulse circuit. The external DC signal is applied to the input terminals E and H or to the input terminals F and H across the resistor R14 and a portion of the control potentiometer RH2 and is applied between the emitter and base of the transistor TR2 in series with the fixed DC voltage derived from the transformer secondary S5 so as to increase the bias on the transistor and raise its effective resistance in the pulse forming circuit.

When supplying power for an extremely heavy load, the power SCR rectifiers PSCR–A and PSCR–B may be connected in parallel with the purpose of supplying a greater current. If on the other hand, the load requires a high supply voltage, then PSCR–A and PSCR–B may be connected in series with each other through the load and their separate gate controls may be operated from individual pulse transformer secondaries in the manner illustrated in FIG. 1A. However, when PSCR–A and PSCR–B are connected as shown in the power circuit of FIG. 1A, they represent two distinctly different load circuits operating from the same control.

In the DC–SCRT circuit, the terminal J is connected directly to the terminal L through condenser C4. Although this condenser is really connected across the switch SWH and the control relay contact CR1, it will be noted that it is utilized solely for the purpose of bypassing transient voltages occurring, for example, when the switch SWH is opened or the control contact CR1 is opened or closed. Transients may effect this circuit to provide erratic operation during stopping or starting, and they may damage the transistor TR2.

The terminal J is likewise connected to the emitter E of the transistor TR2, the collector of which is connected directly to the emitter of the unijunction transistor TR1. The base of TR2 is connected to the line 19 and to one side of the condenser C5 the other side of which is connected to terminal J. The condenser C5 is a transient bypass condenser with a purpose similar to that of condenser C4. Line 19 is connected through condenser C6 to terminal A which is common ground. Condenser C6 is likewise employed for the purpose of bypassing transient voltages to ground that would otherwise provide misoperation when the circuit is opened or closed. Line 19 is connected to the negative side of the full-wave bridge rectifier, comprising diodes D2 to D5 inclusive, the positive side of which is connected by line 18 to one end of resistor R10, the other end of which is connected by line 17 to one end of the potentiometer RH1 that controls the minimum DC voltage to be applied to the transistor TR2. RH1 is connected by the line 16 to one end of the resistance R9 the other end of which is connected directly to line 19. The Zener diode Z3 is connected between lines 17 and 19, the anode being connected to line 19. This Zener diode regulates the DC voltage supplied to the resistance R9 in series with the RH1 potentiometer.

A filtering condenser C7 is connected across the positive and negative points of the bridge rectifier between lines 18 and 19. The AC connections of the bridge rectifier are connected to the terminals D and B which has a low voltage AC input source indicated by the transformer secondary S5.

Thus, the minimum voltage which is supplied by the potentiometer RH1 is connected to the terminal H and represents a minimum amount of power delivered to the load; when the load is an electromagnet driving a vibratory feeder, the minimum feed rate is determined by this minimum voltage. The terminal H is likewise connected to one end of the resistor R14, the other end of which is connected to line 15 and to one end of the potentiometer RH2, the other end of which is connected by the line 14 to one end of the resistor R12, the other end of which is connected directly to the terminal E and to one end of the resistor R13, the other end of which is connected to the terminal F.

The terminals E, F and H represent the DC signal input terminals for controlling the preset minimum to maximum voltage to be applied to the transistor TR2. The terminals E and H are adapted to receive a low voltage input in the nature of one volt and a half, whereas the input terminals F and H are adapted to receive a higher signal input of 10 volts.

A Zener diode Z4 is provided across the high voltage input terminals F and H to limit the maximum voltage applied to the transistor TR2. This Zener diode has a subsidiary purpose of preventing the creation of the triggering pulse from the capacitor C2 prior to the zero voltage reference point (i.e., start of the positive half-cycle) of the AC wave applied to the power circuit. The DC voltage provided by the controlled potentiometer RH2 is added to the minimum DC voltage provided by the control potentiometer RH1 as aforedescribed, and the combined voltage is passed through a resistor R8 to the emitter of transistor TR2. A forward biased diode D1 bypasses the resistor R8 so as to pass an increasing portion of the transistor biasing current at the upper operating levels of the transistor in order to maintain the linearity of the transistor output throughout its operating range, i.e., to keep its output impedance proportional to the DC input voltage between lines 12 and 19.

Referring now to that portion of the circuitry identified in FIG. 1A as the SPC proportional control circuit, the terminal F is connected to the switch 34 which is selectively connected to the switch points 33, 35 and 40, respectively. If the DC signal input to terminals E and H or F and H in the DC-SCRT circuit is to be proportional control, then the switch contact 35 is connected to the terminal F by switch 34. The SPC Proportional Control circuit includes a potentiometer RH5 comprising a slider connected to contact point 35 and a resistor, one side of which is connected to the terminal H and the other side of which is connected to the line 37 which is, in turn, connected to the sliding arm of the master control potentiometer RH9 indicated as MC in the circuit shown in FIG. 1A. The master control potentiometer in turn has one side connected to H which terminal is also connected to the negative output terminal of an AC to DC converter. The opposite side of the potentiometer RH9 is connected by the line 38 to the positive side of the AC to DC converter. The AC to DC converter may include, for example, a bridge rectifier with a filter condenser and a resistor, such as shown at C7 and R10 in the arrangement illustrated in FIG. 1E. The alternating current to the bridge rectifier of such an AC to DC converter is obtained from the opposite ends of the transformer secondary S7.

Thus, the DC voltage picked off the potentiometer RH5 may be connected directly to the F terminal, and there are a series of similar potentiometers RH6, RH7 and RH8 placed in parallel with RH5 which represent the DC input control voltages for 3 different power circuits which are independently operated through control circuitry similar to that shown in FIG. 1A. For example, where the loads associated with each of the control potentiometers RH5–RH8 comprise electromagnet drives for vibratory feeders for the purpose of feeding four different ingredients to a single mix, by the use of the master control MC, each of the DC signal inputs to each of the four distinct and independent control circuits may be varied simultaneously while their relative proportions remain constant.

If the switch 34 is connected to contact point 33 the SMC Load Sensing Unit, as shown in FIG. 1A, is connected to the DC Signal Input terminals. In this unit of the circuitry a reference voltage is obtained from the transformer secondary S6, which is connected by the line 22 and the line 21 to a bridge rectifier made up of diodes D6, D7, D8 and D9. The condenser C9 and resistor R17 represent a filtering combination for the DC provided from the bridge rectifier and operates in conjunction with a regulator provided by Zener diodes Z5 and Z6 which are connected in series across the output of the C9–R17 filter with the anode of Z6 connected to line 23 and the cathode of Z5 connected to line 25. The lines 25 and 23 are connected at opposite ends of the RH3 potentiometer, the slider of which is connected at switch point 33 to supply a positive DC voltage to the input terminal F of a predetermined amount depending upon the setting of the potentiometer RH3.

The voltage source for the control side of the SMC Load Sensing Unit circuit is provided by the operating current to a three phase AC motor through a transformer CT, the secondary of which is connected to a bridge rectifier made up of the diodes D10, D11, D12, and D13. The primary of transformer CT senses the current drawn by the AC motor and the secondary provides an AC voltage to the bridge rectifier proportional to said motor current. The positive side of this bridge rectifier is connected by line 29 through resistor R19 to line 28. A series of filtering condensers C10, C11, C12 and C13 are connected in parallel between line 28 and the negative side of the bridge rectifier represented by line 27. A meter AM is likewise connected in parallel with these condensers between lines 27 and 28 and is calibrated to read directly the current load of the three phase AC motor.

The positive line 28 is connected to one side of the resistance R18, the negative line 23 is connected to the other side of the resistor R18, and a diode D15 is connected with its anode to line 23 and its cathode to line 27.

A blocking diode D14 has its cathode connected to the plus line 28. The line 32 is connected to the anode of diode D14 and to one end of the variable resistor RH4 the opposite end of which is connected to terminal H and the anode of the Zener diode Z7, the cathode of which is connected to the switch point 33 and thence through the switch 34 to the terminal F which is the voltage input terminal for the DC control signal.

The SMC Load Sensing Unit circuit provides a means for using the amount of load current drawn by the three phase AC motor to control the amount of power delivered to the Power Circuit of FIG. 1A. A reference DC voltage is applied to switch point 33, and this voltage is compared across the DC Signal Input terminals F and H with a DC voltage on line 28 derived from the AC motor load current. When the voltage on point 33 is higher than that on line 28, a DC signal is fed into the DC–SCRT circuit to increase the power to PSCR–A or PSCR–B in the manner previously explained. The variable resistor RH4 is utilized as a sensitivity adjustment to predetermine the amount of variation in the DC input signal, and the diode D14 acts to block a reverse input signal which would occur when the voltage at 28 exceeded that at 33.

If the loads in the power circuits fed by PSCR–A or PSCR–B are electromagnetic drives for vibratory feeding devices and if the three phase AC motor drives a crusher receiving material from such feeding devices, then the load on the crusher can be maintained relatively constant with the circuitry described. As the load on the crusher gets higher due to excess feed from the feeding devices, the voltage at 28 will increase until it is equal to that of the preset voltage at 33; at this time, there will be no DC input signal and the power to the feeders will be a minimum. When the load on the crusher is less and it draws a smaller current, the voltage at 28 will correspondingly decrease below the voltage at 33 and a DC input signal will be created to cause a greater delivery of power through PSCR–A and PSCR–B thereby increasing the delivery of the feeding devices controlled by these rectifiers.

Referring to FIG. 1B, an auxiliary circuit is shown which supply a controlled amount of this AC voltage to nals F and H to control the operation of the pulse forming circuitry. The DC signal input terminal F is connected through the switch 34 to the switch contact 40 which is also connected to one side of the resistor R20 the other side of which is connected directly to terminal H through a blocking diode D20. A magnetic amplifier indicated by the two rings of magnetic material 47 and 48, which are made of magnetic material of high retentivity and which are linked by load windings 43 and 45 and the line 44, is connected in a series circuit with the load resistance R20 and an AC source voltage obtained from transformer secondary S8.

The tranformer secondary S9 supplies AC voltage to a variable resistor RH10 through the lines 50 and 51 which supply a controlled amount of this AC voltage to a bridge rectifier made up of the diodes D25, D26, D27 and D28, the positive side of the rectifier being connected by the line 52 to one side of the resistor R21 and thence connected in series with the potentiometer RH14, the other side of which is connected to line 53. The opposite or negative side of this bridge rectifier is connected by the line 55 to one side of the filter condenser C14, the other side of which is connected to the line 53. The lines 53 and 55 are connected to the opposite sides of the reference voltage control winding 54 which is wound in one direction around the two rings 47 and 48 and is an independent winding. Thus, by supplying a fixed DC voltage to the reference voltage control winding, the point at which the magnetic amplifier will saturate to thereby provide current to the load resistor R20 is predetermined.

The opposite side of the magnetic amplifier is provided with a variable voltage control winding 56 which is wound in the opposite direction as reference voltage control winding 54 and has one side connected by the line 60 to one side of a filter capacitor C15, the other side of which is connected to line 61 that is also connected to the other side of the control winding 56.

The control winding 56 is supplied with a control current from the magnetic pickup MP57 which is in the nature of a generator having a permanent magnet fixed to the moving part of a vibratory feeder and a coil connected to a stationary portion of the feeder. Thus, the operation of the feeder provides a voltage in the coil of pickup MP57 which is proportional to the output of the feeder and this alternating voltage is supplied to the AC points of the bridge rectifier denoted by the diodes D21, D22, D23 and D24. The positive output of this full wave rectifier is connected to line 59 and the negative is connected to line 61. The line 59 is also connected to one side of the control potentiometer RH15 the other side of which is connected to the variable voltage control winding 56.

The voltage across the load resistor R20 produced when the magnetic amplifier saturates is then fed to the DC signal input terminals F and H of the DC–SCRT circuit. The blocking diode D20 prevents the negative half of the wave form from appearing across the input terminals F and H as is indicated in FIGURES 1F and 1G. The resultant output is a wave form with a steep leading edge in the form of a pulse rather than a continuous current signal, and this steep leading edge of the wave form is used to trigger the transistor TR2 into conduction. The triggering of the unijunction transistor TR1 is then also controlled by the steep leading edge of this input wave form as shown in FIG. 1G. Thus, the power SCR PSCR–A, or PSCR–B, is controlled by the relative phase relationship of the leading edge of this wave form relative to the AC supply, and this is, in turn, determined by the amount of control voltage applied by the windings 54 and 56 to the magnetic amplifier. The minimum adjusting potentiometer RH1 in the DC–SCRT circuit is set to produce a minimum output. The maximum adjustment potentiometer RH2 in the DC–SCRT circuit is adjusted for suitable operation of the transistor TR2 when it is supplied by voltage pulses from the circuitry of FIG. 1B.

Having completed a detailed description of the invention so that those skilled in the art could practice the same, I claim:

1. A unit triggering circuit, for controlling a power SCR actuating a load connected to an AC power operating source, and including a pulse transformer having at least one secondary winding connected across the gate and cathode of said power SCR and also connected across a load terminator resistor, said pulse transformer primary connected at one end to the first base of an unijunction transistor and the second base of which is connected through a second resistor to a positive polarity voltage terminal, a complementary negative polarity voltage terminal connected through a third resistor to the other end of said pulse transformer primary, said positive and negative terminals being connected to an AC source voltage, a pulse Zener diode having its cathode connected to said positive polarity voltage terminal and its anode connected to said other end of said pulse transformer, a pulse condenser having one lead connected to the anode of said pulse Zener diode and its other lead connected to the emitter of said unijunction transistor, and a pulse condenser control circuit means connected between said positive polarity voltage terminal and said emitter of said unijunction transistor, and means for phase shifting said AC source voltage at said positive and negative terminals so that it leads said AC power operating source.

2. The unit triggering control circuit of claim 1 which also includes between said connections to said power SCR and said pulse transformer secondary a network consisting of a capacitor connected in parallel with a current limiting resistor and having one end connected to the gate of the power SCR and the other end connected to the cathode of a Zener diode with the anode of the latter connected to the cathode of said power SCR, a series connected combination of a control SCR, a second current limiting resistor and a low voltage AC source, said Zener diode being connected in parallel with said series connected combination, and said gate and cathode of said control SCR being connected across said pulse transformer secondary.

3. The unit triggering control circuit of claim 1 wherein said pulse condenser control circuit means comprises a potentiometer and a further resistor connected in series and connected between said positive voltage terminal and said emitter of said unijunction transistor.

4. The unit triggering control circuit of claim 2 wherein said pulse condenser control circuit means comprises a variable control DC signal voltage supply means connected between said positive terminal and said emitter of said unijunction transistor to vary the effective impedance therebetween and regulate the operation of said pulse condenser and control the operation of said power SCR.

5. The unit triggering control circuit of claim 2 wherein said means for phase shifting said AC source voltage comprises a transformer secondary winding having a center tap connected to said positive voltage terminal, one end of said secondary winding connected through a fifth resistor to said negative voltage terminal, the other end of said secondary winding connected through a third capacitor to said negative voltage terminal, said pulse condenser control circuit means comprising a variable control DC voltage supply means connected between said positive voltage terminal and said emitter of said unijunction transistor to vary the effective impedance therebetween and regulate the operation of said pulse condenser and control the operation of said power SCR.

6. The unit triggering control circuit of claim 5 wherein voltage at said one end of said secondary winding has the same phase relationship as the low voltage AC source connected to said control SCR.

7. The unit triggering control circuit of claim 2 wherein said means for phase shifting said AC source voltage comprises a transformer secondary winding having a center tap connected to said positive voltage terminal, one end of said secondary winding connected through a fifth resistor to said negative voltage terminal, the other end of said secondary winding connected through a third capacitor to said negative voltage terminal, and said pulse condenser control circuit means comprises a potentiometer and a fourth resistor connected in series and connected between said positive voltage terminal and said emitter of said unijunction transistor.

8. The unit triggering control circuit of claim 4 wherein said variable control DC signal voltage supply means includes a second transistor having its collector connected to the emitter of said unijunction transistor and its emitter connected to said positive voltage terminal, a variable DC bias voltage means having its negative side connected to the base of said second transistor and the positive side connected through a sixth resistor in parallel with a diode to said positive voltage terminal.

9. The unit triggering control circuit of claim 8 wherein said variable DC bias voltage means includes a minimum DC bias voltage supplied from a fixed source and a DC pilot control signal input, said minimum DC bias voltage and said DC pilot control signal input being connected in series.

10. The unit triggering control circuit as set forth in claim 9 wherein both said minimum DC bias voltage and said DC pilot control signal input are supplied by variable resistors connected in series across the base and emitter of said second transistor whereby said minimum and maximum amounts of power delivered to the load from said power SCR can be independently adjusted.

11. The unit triggering control circuit as set forth in claim 9 including a Zener diode connected across said DC pilot control signal input to limit the maximum amount of voltage which can be applied thereto.

12. The unit triggering control circuit of claim 9 wherein said minimum DC bias voltage includes a bridge rectifier with a ninth filter condenser and twelfth resistance in parallel with the positive voltage connection leading from said bridge rectifier.

13. The unit triggering control circuit of chain 9 including a plurality of said unit triggering circuits independent from each other, and where in each said DC pilot control signal input is connected to a slide arm and one end of a respective independent potentiometer, a DC supply, a master potentiometer connected across said DC supply, and the slide arm of said master potentiometer and one end thereof being connected to the ends of each independent potentiometer to control all of said independent unit triggering circuits simultaneously.

14. The unit triggering control circuit of claim 9 wherein said DC pilot control signal input includes an opposed loop circuit one side of which is supplied by a controlled reference DC voltage source, the other side of said opposed loop circuit being supplied an opposed load varying DC voltage source.

15. The unit triggering control circuit as set forth in claim 14 including a blocking diode between said controlled reference DC voltage source and said load varying DC voltage source with the cathode thereof connected to said load varying DC voltage source whereby said DC pilot control signal input will comprise only the excess of said reference voltage over said load varying voltage.

16. The unit triggering control circuit of claim 15 wherein said load varying DC voltage source includes a current transformer in the load circuit of an AC crusher motor, to supply a load variable voltage that is connected to a bridge rectifier, the positive of which is connected to the cathode of said blocking diode.

References Cited

UNITED STATES PATENTS

| | | | |
|---|---|---|---|
| 3,253,202 | 5/1966 | Cotton | 318—227 |
| 3,295,020 | 12/1966 | Borkovitz | 307—252 X |
| 3,308,340 | 3/1967 | Gille et al. | 307—252 X |
| 3,319,147 | 5/1967 | Mapham | 307—252 X |
| 3,394,297 | 7/1968 | Risberg | 318—227 |

JOHN S. HEYMAN, Primary Examiner

U.S. Cl. X.R.

307—252, 262

PO-1050
(5/69)

UNITED STATES PATENT OFFICE
CERTIFICATE OF CORRECTION

Patent No. 3,474,316    Dated February 12, 1971

Inventor(s) J. D. SCOTT

It is certified that error appears in the above-identified patent and that said Letters Patent are hereby corrected as shown below:

Column 3, line 26, "load" should be --lead--. Column 4, line 64, "CF" should be --CR--. Column 5, line 26, "and" should be --of--. Column 8, line 27, after "which" insert --is adapted to feed a pulse into the DC input terminals--. Column 8, line 27, delete "supply a controlled amount of this AC voltage to". Column 8, line 28, delete --nals--. Column 9, line 71 "further" should be --fourth--. Column 10, line 67, "chain" should be --claim--.

Signed and sealed this 19th day of October 1971.

(SEAL)
Attest:

EDWARD M.FLETCHER,JR.
Attesting Officer

ROBERT GOTTSCHALK
Acting Commissioner of Patents